United States Patent
Linke

(10) Patent No.: US 6,919,221 B2
(45) Date of Patent: Jul. 19, 2005

(54) ELECTRONIC MODULE HAVING A PLASTIC HOUSING WITH CONDUCTIVE TRACKS AND METHOD OF ITS PRODUCTION

(75) Inventor: Ralph Linke, Radolfzell (DE)

(73) Assignee: TRW Automotive Electronics & Components GmbH & Co. KG, Radolfzell (DE)

( * ) Notice: Subject to any disclaimer, the term of this patent is extended or adjusted under 35 U.S.C. 154(b) by 153 days.

(21) Appl. No.: 10/274,714

(22) Filed: Oct. 21, 2002

(65) Prior Publication Data

US 2003/0087470 A1 May 8, 2003

(30) Foreign Application Priority Data

Oct. 23, 2001 (DE) .......................................... 101 52 137

(51) Int. Cl.⁷ .............................................. H01L 21/48
(52) U.S. Cl. ........................................................ 438/106
(58) Field of Search .......................................... 438/106

(56) References Cited

U.S. PATENT DOCUMENTS

| | | | | |
|---|---|---|---|---|
| 4,499,519 A | * | 2/1985 | Fishman | ................... 361/306.2 |
| 4,504,012 A | * | 3/1985 | Fetty et al. | ................ 238/10 F |
| 4,627,678 A | * | 12/1986 | Biswas | .......................... 439/75 |
| 4,689,103 A | | 8/1987 | Elarde | .......................... 156/245 |
| 4,758,459 A | * | 7/1988 | Mehta | .......................... 174/255 |
| 5,659,153 A | * | 8/1997 | Narayan et al. | ............. 174/255 |
| 6,521,830 B1 | | 2/2003 | Platz | |
| 6,796,851 B2 | * | 9/2004 | Trogisch et al. | ............. 439/722 |
| 2003/0021541 A1 | * | 1/2003 | Carpenter | ..................... 385/52 |
| 2003/0179550 A1 | * | 9/2003 | Nebrigic et al. | ............. 361/729 |

FOREIGN PATENT DOCUMENTS

| | | |
|---|---|---|
| DE | 9300867 U | 7/1994 |
| DE | 4416986 A1 | 5/1995 |
| DE | 4447631 C2 | 9/1998 |
| DE | 19755155 A1 | 6/1999 |
| DE | 19944383 A1 | 4/2001 |
| EP | 1085787 | 3/2001 |

* cited by examiner

*Primary Examiner*—W. David Coleman
(74) *Attorney, Agent, or Firm*—Tarolli, Sundheim, Covell & Tummino L.L.P.

(57) ABSTRACT

The electronic module whose electronic components are connected by conductor tracks has a housing with a base body housing made of electrically non-conductive plastic. The base body housing is provided with recessed conduits on the inside surface of its housing wall, and a galvanizable plastic is introduced into these conduits. The conductor tracks are formed by a metallization applied onto the galvanizable plastic and they can run three-dimensionally along different wall sections of the base body housing.

10 Claims, 3 Drawing Sheets

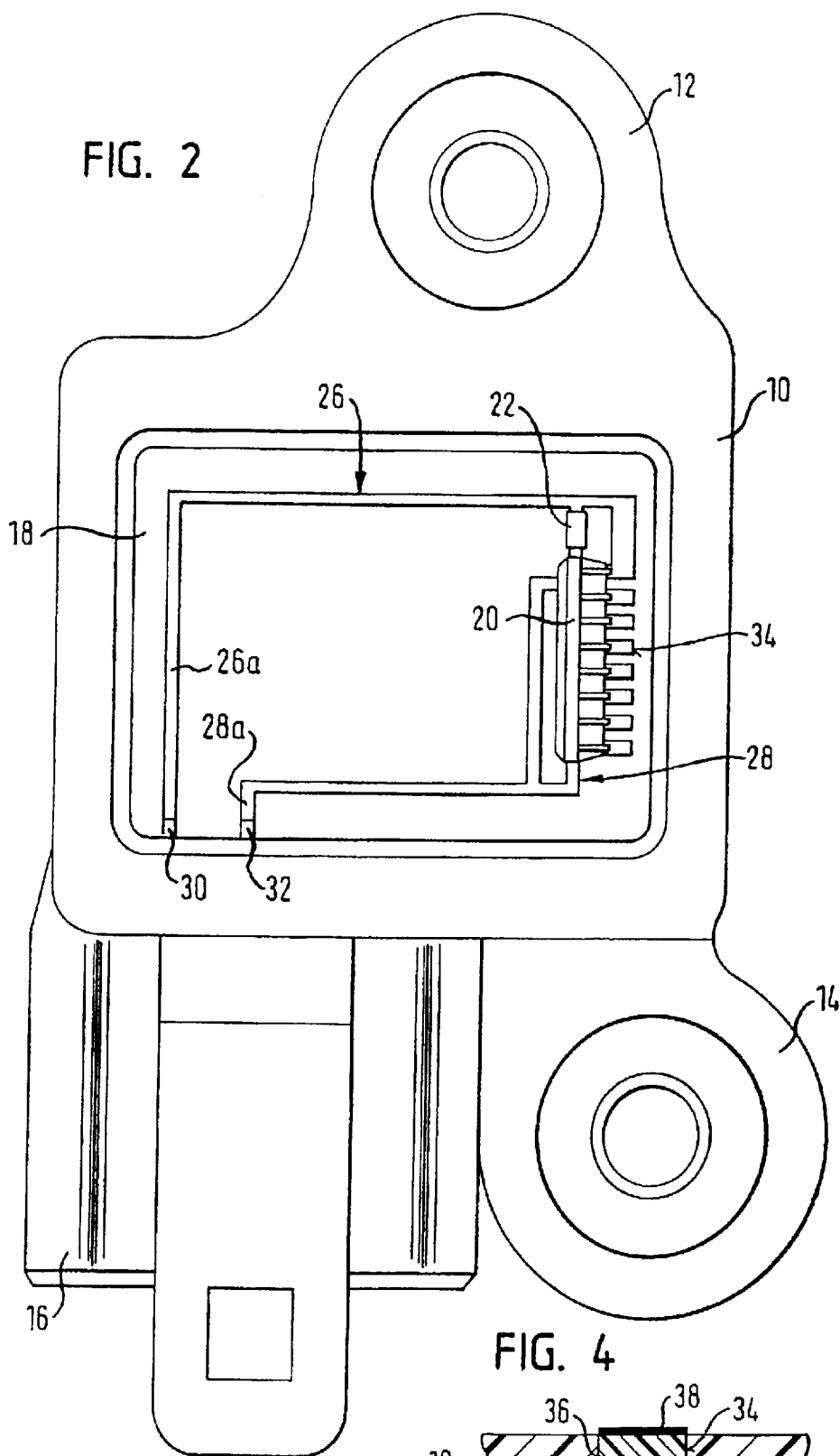
FIG. 2
FIG. 4
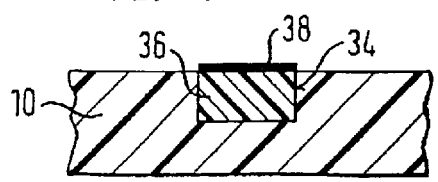

ELECTRONIC MODULE HAVING A PLASTIC HOUSING WITH CONDUCTIVE TRACKS AND METHOD OF ITS PRODUCTION

FIELD OF THE INVENTION

The invention relates to an electronic module and to a method of producing the electronic module, in which the electronic components are connected in a plastic housing by conductor tracks.

BACKGROUND OF THE INVENTION

Conventional electronic modules with plastic housings have a printed circuit board onto which the electronic components are attached and electrically connected. If the electronic module is an actuation device for occupant restraint systems in vehicles, then one of the electronic components mounted on the printed circuit board is an acceleration sensor that has to be arranged with a specific orientation in the vehicle. Therefore, the printed circuit board is installed in the plastic housing with a specific orientation established by support walls, stops and contact surfaces on the inside of the housing. The housing, in turn, is attached in the vehicle in a precisely specified orientation. For different sensing directions, with the same orientation of the housing in the vehicle, the printed circuit boards have to be arranged with appropriately different orientations inside the housing. This means that each sensing device requires its own housing, and an appropriate tool is needed for its production, generally by means of injection molding. Moreover, the different installation conditions inside the housing, depending on the orientation, call for differently designed printed circuit boards and corresponding connections to the housing with plug connectors. These aspects add considerably to the production costs of such electronic modules

SUMMARY OF THE INVENTION

The present invention provides a method of producing an electronic module by means of which conventional printed circuit boards are no longer necessary and components such as acceleration sensors can be positioned in various orientations inside the plastic housing that has been made with one and the same tool. According to the invention, first of all, a base body housing is made of an electrically non-conductive plastic with recessed conduits. A galvanizable plastic is then introduced into these conduits. Subsequently, the surface of the galvanizable plastic is metallized. Finally, the electronic components are placed onto the conductor tracks created by the metallization and connected to them. The conductor tracks made in this manner can completely replace a printed circuit board. At the same time, they can replace the connection lines between a conventional printed circuit board and contact pins on the plug base of the electronic module. The plastic housing is preferably manufactured by means of two-component injection molding technology. For different orientations of the electronic components inside the housing, correspondingly different conductor tracks are needed. The conduits that have to be left open for this on the inside of the housing are created by interchangeable mold cores. However, the same injection molding tool can be used for all orientations.

The invention also provides an electronic module that can be made by means of the method according to the invention in which the electronic components are connected in a plastic housing by means of conductor tracks. This housing has a base body housing made of electrically non-conductive plastic, and the inner surface of its housing wall is provided with recessed conduits. A galvanizable plastic is introduced into these conduits. The conductor tracks are formed by a metallization applied onto the galvanizable plastic The electronic components are mounted on the conductor tracks and preferably connected to them by means of soldering.

It is especially advantageous for the invention to be used for electronic modules that serve to actuate restraint systems in vehicles and that, as one of the electronic components, comprise an acceleration sensor that is arranged in a precisely defined orientation inside the plastic housing.

BRIEF DESCRIPTION OF THE DRAWINGS

Additional characteristics and advantages of the invention ensue from the description below of a preferred embodiment and from the accompanying drawings. The drawings show the following:

FIG. 2 an analog view of a second embodiment,

FIG. 4 an enlarged partial view along line III—III in FIG. 1.

DETAILED DESCRIPTION OF THE PREFERRED EMBODIMENTS

Figure 1:
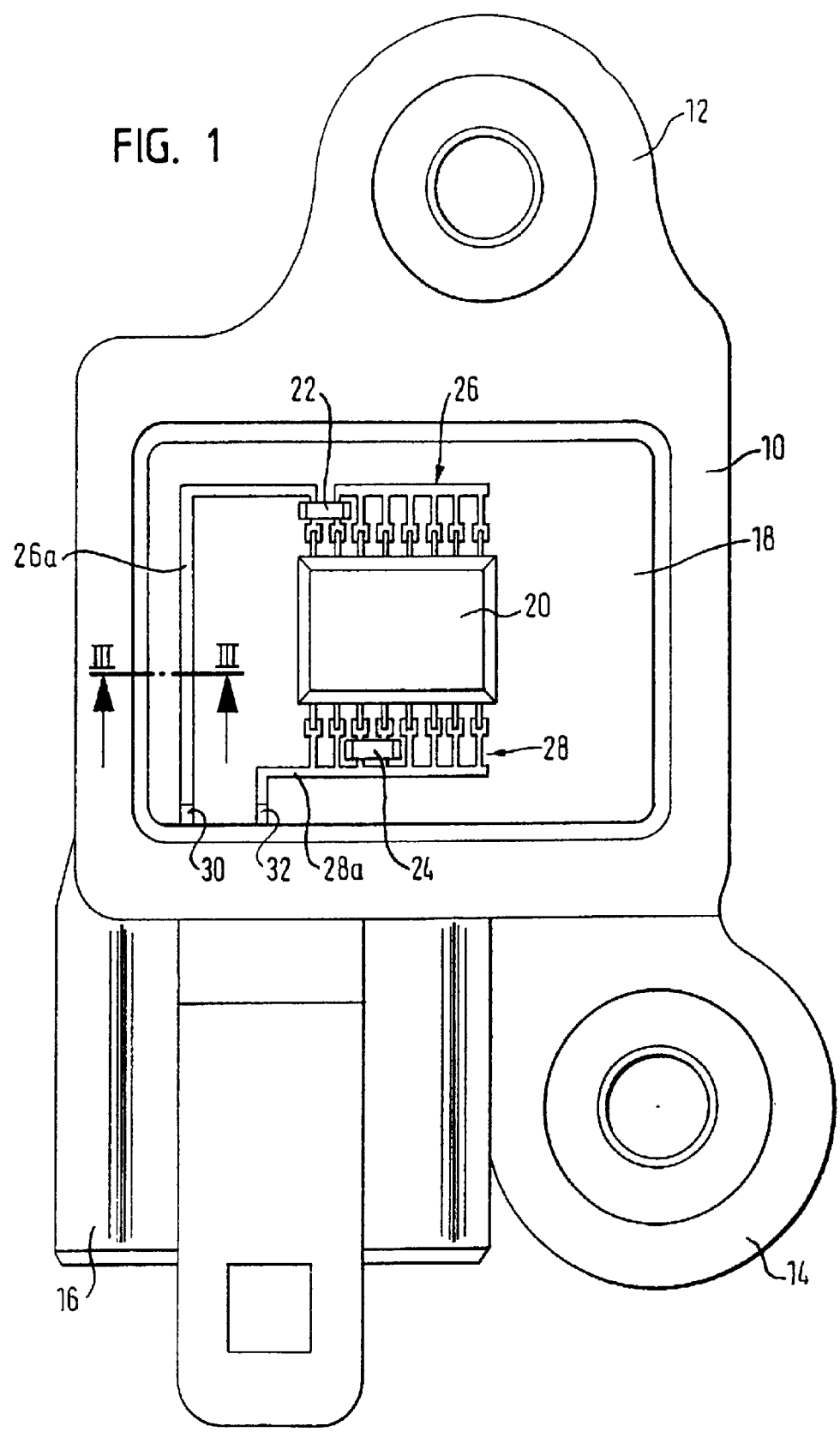
FIG. 1 first embodiment in a top view onto an open housing.

The electronic module, which is shown in FIG. 1 with the cover removed, has a plastic housing with a generally cuboidal base body housing 10 that has two shaped-on fastening lugs 12, 14 and a likewise one-piece, shaped-on plug base 16. Inside the base body housing 10, there is a cavity 18 in which electronic components 20, 22 and 24 are arranged. These electronic components 20, 22 and 24 are mounted on conductor tracks 26, 28 and connected to them by means of soldering. The electronic component designated with 20 comprises an acceleration sensor that has to have a specific orientation inside the housing. In the example shown here, the electronic component 20 is placed flat onto the bottom of the base body housing 10.

The plug base 16 surrounds two contact pins 30, 32, which penetrate through the wall of the base body housing and which project into the inside of the base body housing 10. The contact pins 30, 32 are linked by conductor track sections 26a, 28a to the conductor track system to which the electronic components 20, 22 and 24 are connected.

The described plastic housing of the electronic module is produced by means of injection molding. In order to form the cavity 18 in the base body housing 10, a mold core is placed into the injection molding tool. On its outside, the mold core has protruding ribs whose shape and arrangement correspond to the required conductor tracks. By means of these ribs, conduits 34 (FIG. 4) are formed on the inside surface of the base body housing 10. In a subsequent injection molding process, these conduits 34 are filled with a galvanizable plastic 36. Galvanizable plastics are especially those that contain palladium ions. Then a metallization 38 is galvanically deposited onto the surface of the plastic 36 that fills the conduits 34. The metallization 38 can consist of copper, zinc, tin or gold. The ends of the contact pins 30, 32 projecting into the housing are surrounded by corresponding areas of the conductor track sections 26a, 28a. During the electrochemical metallization, a connection is also made to the contact pins 30, 32.

The conductor tracks 26, 28 lie in a shared plane since they are formed in the bottom wall of the base body housing 10. The ends of the conductor track sections 26a, 28a that lead to the contact pins 30, 32, however, run perpendicular to the bottom surface of the base body housing 10 A special aspect of the process described is precisely the fact that three-dimensional conductor track systems can be set up. For this purpose, the mold core placed into the injection mold merely has to have corresponding ribs on its outer surfaces.

Figure 3:
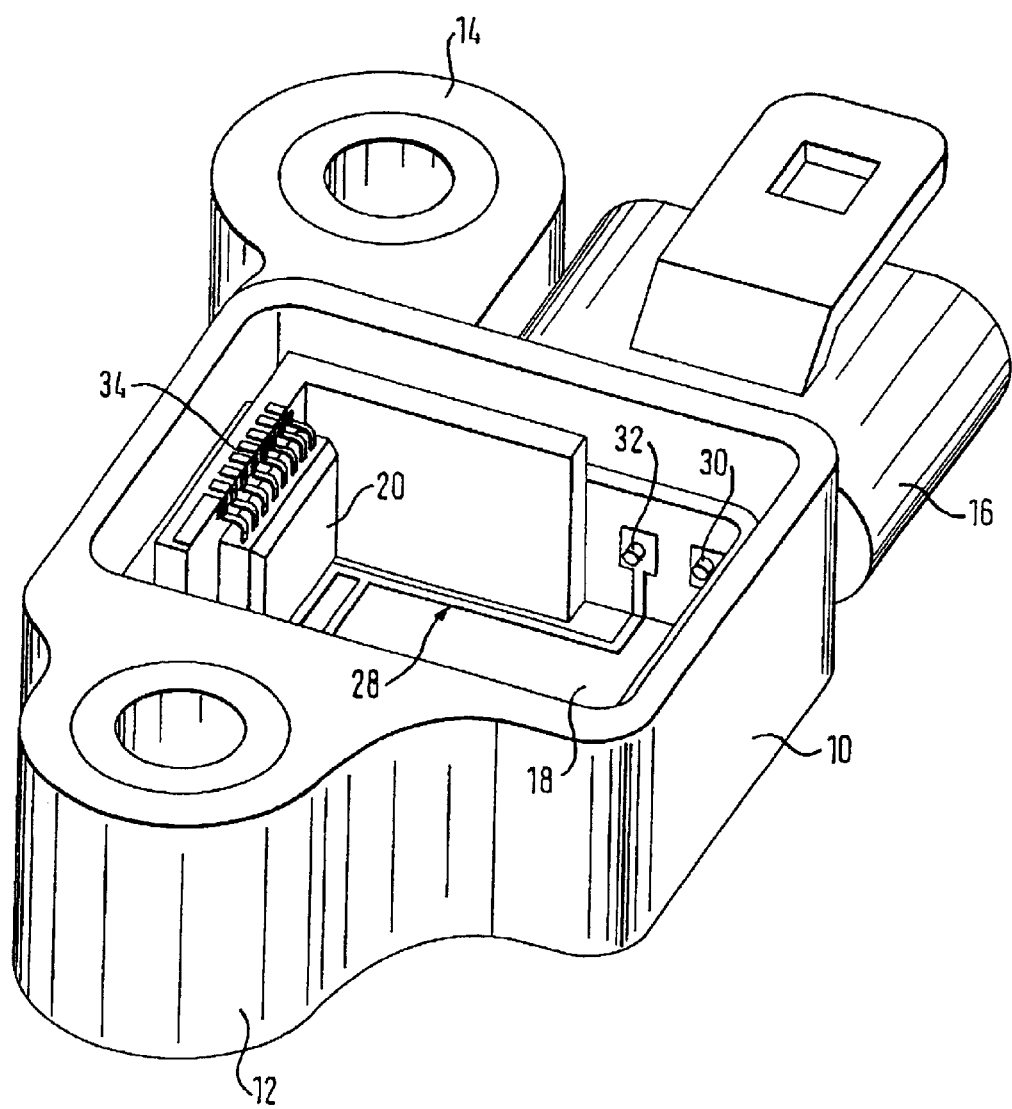
FIG. 3 a perspective view of the embodiment according to FIG. 2.

The embodiment shown in FIGS. 2 and 3 differs from that of FIG. 1 only through the orientation of the electronic components and the corresponding configuration and arrangement of the conductor tracks inside the base body housing. In particular, the electronic component 20 comprising the acceleration sensor is arranged parallel to a side surface and thus perpendicular to the bottom surface of the base body housing 10. The base body housing 10 with the shaped-on fastening lugs 12, 14, the shaped-on plug base 16 and the cuboidal inner cavity 18, however, exactly matches the embodiment shown in FIG. 1. Therefore, the same injection molding tool is used for both embodiments. Only the mold core is replaced for one in which the ribs situated on its outer surface correspond to the conductor track system needed for the desired orientation of the component 20. This conductor track system, in turn, comprises conductor tracks 26, 28 in the bottom surface of the base body housing 10 with conductor track sections 26a, 28a whose ends are bent and lead up to the contact pins 30, 32. However, it also comprises conductor tracks 34 that are arranged in a side wall that is perpendicular to the bottom wall of the base body housing 10. The electronic component 20 is mounted on these conductor tracks 34 and soldered to them. In contrast, the electronic component 22 is mounted on the conductor tracks 26 and soldered to them. Consequently, electronic components can be arranged and attached to different inside surfaces of the base body housing 10.

What is claimed is:

1. A method of producing an electronic module comprising electronic components and a plastic housing, wherein
    a base body housing is made of an electrically non-conductive plastic with recessed conduits;
    a galvanizable plastic material is introduced into the conduits;
    exposed surface areas of the galvanizable plastic material are metallized thereby forming conductor tracks,
    the electronic components are placed onto said conductor tracks and both electrically and mechanically connected to the conductor tracks,
    wherein housings with different conductor tracks or a different arrangement of the electronic components are produced with one and the same injection mold by interchangeable mold cores.

2. The method according to claim 1, wherein the base body housing is made by means of injection molding.

3. The method according to claim 2, wherein the conduits are formed by means of an interchangeable mold core.

4. The method according to claim 3, wherein the galvanizable plastic material is introduced into the conduits by means of injection molding.

5. The method according to claim 1, wherein contact pins that project into the inside of the base body housing are electrically contacted with surrounding conductor tracks in the step of metallizing exposed surface areas of the galvanizable plastic material.

6. An electronic module comprising electronic components and a plastic housing, wherein the housing has a base body housing made of electrically non-conductive plastic, internal housing walls of said base body housing having recessed conduits therein in which a galvanizable plastic material has been introduced, and conductor tracks are formed by a metallization applied onto exposed surface areas of the galvanizable plastic material, and said electronic components being connected to said conductor tracks, wherein the electronic components are placed onto the conductor tracks and are connected to them by means of soldering.

7. The electronic module according to claim 6, wherein the conductor tracks are shaped three-dimensionally into different wall sections of the base body housing that are connected to each other at an angle.

8. The electronic module according to claim 6, wherein the electronic components comprise an acceleration sensor.

9. An electronic module comprising electronic components and a plastic housing, wherein the housing has a base body housing made of electrically non-conductive plastic, internal housing walls of said base body housing having recessed conduits therein in which a galvanizable plastic material has been introduced, and conductor tracks are formed by a metallization applied onto exposed surface areas of the galvanizable plastic material, and said electronic components being connected to said conductor tracks, wherein the electronic components comprise an acceleration sensor.

10. The electronic module according to claim 9, wherein said acceleration sensor is used to actuate an occupant restraint system for a vehicle.

* * * * *